(12) United States Patent
Zindulka et al.

(10) Patent No.: US 9,090,961 B2
(45) Date of Patent: Jul. 28, 2015

(54) MAGNETRON SPUTTERING PROCESS

(75) Inventors: Ondrej Zindulka, Rapotin (CZ);
Mojmir Jilek, Sumperk (CZ)

(73) Assignee: Pivot A.S. (CZ)

( * ) Notice: Subject to any disclaimer, the term of this patent is extended or adjusted under 35 U.S.C. 154(b) by 0 days.

(21) Appl. No.: 13/980,433

(22) PCT Filed: Dec. 31, 2011

(86) PCT No.: PCT/EP2011/074335
§ 371 (c)(1),
(2), (4) Date: Sep. 13, 2013

(87) PCT Pub. No.: WO2012/104002
PCT Pub. Date: Aug. 9, 2012

(65) Prior Publication Data
US 2014/0042015 A1    Feb. 13, 2014

(30) Foreign Application Priority Data

Feb. 4, 2011 (EP) .................................... 11153461

(51) Int. Cl.
*C23C 14/00* (2006.01)
*C23C 14/35* (2006.01)
*H01J 37/34* (2006.01)

(52) U.S. Cl.
CPC ............. *C23C 14/0042* (2013.01); *C23C 14/35* (2013.01); *H01J 37/3405* (2013.01)

(58) Field of Classification Search
CPC .. C23C 14/0042; C23C 14/35; H01J 37/3405

USPC ......................................... 204/192.13, 298.03
See application file for complete search history.

(56) References Cited

U.S. PATENT DOCUMENTS

| 4,166,784 A | 9/1979 | Chapin et al. |
| 4,328,812 A | 5/1982 | Ufford et al. |
| 4,379,040 A * | 4/1983 | Gillery ..................... 204/192.13 |
| 5,492,606 A | 2/1996 | Stauder et al. |
| 6,743,341 B2 | 6/2004 | Szczyrbowski et al. |
| 7,232,506 B2 * | 6/2007 | George et al. ............ 204/192.13 |
| 2002/0157945 A1 | 10/2002 | Szczyrbowski et al. |
| 2006/0219678 A1 | 10/2006 | Sopori |

FOREIGN PATENT DOCUMENTS

| CA | 1 198 085 | 12/1985 |
| EP | 0 795 623 A1 | 9/1997 |

(Continued)

OTHER PUBLICATIONS

Oscillation definition. Merriam-Webster Online Dictionary. [http://www.merriam-webster.com/dictionary/oscillation] [Acessed on Jun. 9, 2014].*

(Continued)

*Primary Examiner* — Michael Band
(74) *Attorney, Agent, or Firm* — George Pappas

(57) ABSTRACT

To control reactive magnetron sputtering process using a reactive gas or reactive gases the process overall pressure is regulated by means of the flow of the reactive gas or the reactive gases, respectively. Oscillations of the flow of the reactive gas or the reactive gases, respectively are determined and used as feedback to determine the process overall pressure.

5 Claims, 3 Drawing Sheets

(56) References Cited

FOREIGN PATENT DOCUMENTS

| WO | WO 2005/036601 A2 | 4/2005 |
|---|---|---|
| WO | WO 2005/036607 A2 | 4/2005 |

OTHER PUBLICATIONS

A.F. Hmiel, Partial pressure control of reactively sputtered titanium nitride, J. Vac. Sci. Technol. A 3 (3), May/Jun. 1985, pp. 592-595.

U. Heister et al., TwinMag II: Improving an advanced sputtering tool; Vacuum 59 (2000), pp. 424-430.

J. Musil et al., Reactive magnetron sputtering of thin films: present status and trends; Thin Solid Films, 475 (2005), pp. 208-218.

W.D. Sproul et al., The Effect of Target Power on the Nitrogen Partial Pressure Level and Hardness of Reactively Sputtered Titanium Nitride Coatings; Thin Solid Films, 171.

H. Ohsaki et al., High rate sputter deposition of $TiO_2$ from $TiO2$-x target; Thin Solid Films 351 (1999), pp. 57-60.

A.J. Aronson et al., Preparation of Titanium Nitride by a Pulsed D.C. Magnetron Reactive Deposition Technique Using the Moving Mode of Deposition; Thin Solid Films, 72 (1980).

* cited by examiner

MAGNETRON SPUTTERING PROCESS

This application claims priority from PCT Application No. PCT/EP2011/074335 filed Dec. 31, 2011 which claims priority from European Application No. EP 11153461.6 filed on Feb. 4, 2011, which applications are incorporated herein by reference.

FIELD OF INVENTION

The invention is related to a method of control of a reactive magnetron sputtering process by changing the flow of the reactive gas in dependence on process overall pressure.

BACKGROUND OF INVENTION

Several methods of coating preparation by reactive magnetron sputtering are known. Typically, in these methods, there is implemented a method of control which allows depositing of coatings with given amount of reactive gas in the coating. Among them are especially important coatings, when the amount of reactive gas corresponds to a stoichiometric coating. Growth rate of overstoichiometric coatings is typically significantly lower than the one of understoichiometric coatings. Understoichiometric coatings, however, are characterized by significantly worse mechanical properties. Known methods of controlling the amount of the reactive gas in a coating deposited by method of reactive sputtering can be summarized as:

In accordance with the document by A. F. Hmiel, published in J. Vac. Sci. Technol. A, 3 (1985) 592-595. a method of control by changing flow of reactive gas in dependence of the partial pressure of the reactive gas (nitrogen) is known. Quadrupole mass spectrometer was used to measure the partial pressure of nitrogen.

In accordance with document EP 0 795 623 A1 a method of control by changing flow of reactive gas in dependence on partial pressure of reactive gas (oxygen) is know. A Lambda probe was used in this document to measure the partial pressure of oxygen. I In accordance with document Heister et al., Vacuum 59 (2000) 424-430 a method of control by changing power supplied to cathode in dependence on partial pressure of reactive gas (oxygen) is known. It is possible to measure the partial pressure of the oxygen by any sufficiently fast and precise sensor (mass spectrometer, lambda probe).

In accordance with patent document U.S. Pat. No. 4,166,784 A a method of control by changing deposition parameters (flow of reactive gas, current between cathodes) by the means of optical emission spectroscopy or voltage on discharge is known.

All above described methods of control can be successfully used for lower deposition rates and/or higher pumping speeds. It is often hard to reach sufficiently high pumping speeds to obtain high deposition rates, which makes it hard to find stable conditions for the described methods of control. The reason is significant hysteresis behavior as described by Musil et al., published in Thin Solid Films 475 (2005) 208-18 and Sproul et al., published in Thin Solid Films, 171 (1989) 171-181. Patent documents CA 1 1980 85 A1 and U.S. Pat. No. 5,492,606 A discuss this problem.

In accordance with the patent document CA 1 198 085 A1 a method of stabilization of hysteresis behavior of the system for reactive magnetron sputtering by pulsing the flow of reactive gas is known. The time ($T_{OFF}$) for which the value of reactive gas flow is lower is not necessarily equal to the time ($T_{ON}$) for which the value of reactive gas flow is higher. These time values are recommended to be in the range of 0.2 to 0.5 s, in order to allow better deposition rates than according to the formerly published document Aronson et al., Thin Solid Films, 72 (1980) 535-540, where respective time values of $T_{ON}$=1.6 s, $T_{OFF}$=1 s are suggested.

In accordance with the patent document U.S. Pat. No. 5,492,606 A a method of stabilization of hysteresis behavior of the system for reactive magnetron sputtering by low frequency pulsing of power applied on target is known. According to this document the recommended frequency values are 1 to 100 Hz and the recommended time values, for which the power on target is lowered, are 1 to 800 ms.

In accordance with the document by Ohsaki et al., published in Thin Solid Films 351 (1999) 57-60 a method of stabilization of hysteresis behavior of the system for reactive magnetron sputtering using sub-stoichiometric $TiO_{2-x}$ target. Target is produced by plasma spraying method.

SUMMARY OF THE INVENTION

The objective of the invention is to find an improved method of control of reactive magnetron sputtering process.

During the deposition of stoichiometric coating by magnetron sputtering it is necessary to constantly correct the process overall pressure. The significance of this correction grows for systems with high power of magnetron and insufficient pumping speed.

The reason for this inevitable correction is an inaccuracy in long-term calibration of vacuum gauges, change of target surface quality during the process, change of temperature in chamber (might not necessarily be detected by temperature measurement), gradual lowering of partial pressure of impurities compared to process initial phases. The invention solves finding a feedback for controlling an optimal process overall pressure and its through-correction during a process.

The new solution lies in finding an optimal feedback between evaluated process overall pressure and controlled flow of gas. In the beginning of hysteresis, there is oscillation of feedback, in a way that is directly dependent on used probe for process overall pressure measuring, applied system of gas input, size of vacuum chamber, pumping speeds of applied vacuum pumping system, applied power of magnetron and type of feedback regulation used. By correct adjustment of applied feedback regulation it is possible to ensure, that the process will be kept in precisely defined beginning of hysteresis zone based on the size of the feedback amplitude.

The whole method of control is described for case of nitrogen reactive gas. Its reproducibility was also experimentally proved for other reactive gasses.

FIG. 1 shows dependency of nitrogen partial pressure on nitrogen flow for reactive magnetron sputtering using a Ti target and a target power of 10 kW (taken from Sproul et al., published in Thin Solid Films, 171 (1989) 171-181.

For stoichiometric coating it is optimal to operate in zone B. In zone A understoichiometry coating is deposited, in zone C overstoichiometry coating is deposited. From FIG. 1 it is obvious, that by changing of the nitrogen flow in zone A induces just a very small change of nitrogen partial pressure (and thus also the process overall pressure). On the contrary even a small change of nitrogen flow in zone B induces large change of the process overall pressure. This fact is successfully used in method of control proposed by us.

A PID (proportional, integral, derivative, herein after PI) algorithm of regulation was used for process overall pressure regulation by means of nitrogen flow. Proposed method of process control can be used also with other regulation algorithms. Now we will set constantly higher and higher process overall pressure, upon which we intent to regulate and will study the flow set by the PI regulator. This experiment is presented in FIG. 2. FIG. 1 shows the dependence of nitrogen flow on nitrogen process overall pressure used for regulation, where the identified zones A, B, and C correspond to the respective zones on FIG. 1

If the proportional and integral factors of PI regulator are set correctly and the request for the gas regulation comes from zone B, the regulator oscillates—as indicated by point B in FIG. 2—and this amplitude is the higher the closer the value of the process overall pressure upon which we regulate is to zone C—as indicated by point "B→C" in FIG. 2. A very low amplitude of nitrogen flow then corresponds to zone A. It was proven experimentally that one can get a coating with an optimal stoichiometry, if the requested value of oscillation is set between amplitude values corresponding to points A and B→C.

One advantage of the proposed system of process control particularly lies in the fact, that it is not necessary to set the initial process overall pressure precisely. It is sufficient if any pressure between points B and C is set as the initial. The algorithm itself finds the right process overall pressure. Another advantage of the invention becomes clear by comparing with the existing state—it is not necessary to apply regulation upon the partial pressure of the reactive gas. Therefore it is possible to use the process overall pressure in the chamber and the regulation functionality remains unchanged. It is also not necessary to precisely calibrate the vacuum gauge used for process overall pressure measurement. This system of control allows finding of long-term stable conditions for deposition of sufficiently stoichiometric coatings.

Advantageously the regulation of the process overall pressure using the flow of the reactive gas or the reactive gases, respectively, is controlled by means of a PID regulator. In detail the mean deviation from last N values of reactive gas—which is nitrogen in a preferred embodiment—flow $\bar{d}$ is used for the inventive regulation of the process overall pressure value, wherein $$\bar{d} = \frac{1}{N}\sum_{i=1}^{N} |q_i - \bar{q}|,$$

wherein $$\bar{q} = \frac{1}{N}\sum_{i=1}^{N} q_i,$$

where $q_i$ is i-th measured reactive gas value. $q_N$ is latest reactive gas value measured, $q_{N-1}$ is reactive gas value measured before $q_N$, continuing to $q_1$, which is last reactive gas value taken into consideration.

N is higher than 2, preferably 8 to 12 and most preferably 10 for an initial rough, fast search and preferably 25 to 35, most preferably 30 for slow fine tuning. The reactive gas used is selected of the group including nitrogen and oxygen and a mixture of nitrogen and oxygen.

The abovementioned elements and also the elements to be used according to the invention and claimed and described in the following exemplary embodiments are—beyond the explicit definitions of the claims—subject to no particular exceptions in terms of their size, shaping, use of material and their technical design, and so the selection criteria known in the respective field of use can be used in an unrestricted manner.

BRIEF DESCRIPTION OF THE DRAWINGS

Exemplary embodiments of the invention will be described in more detail below with reference to drawings, in which.

DESCRIPTION OF PREFERRED EMBODIMENT

Figure 5:
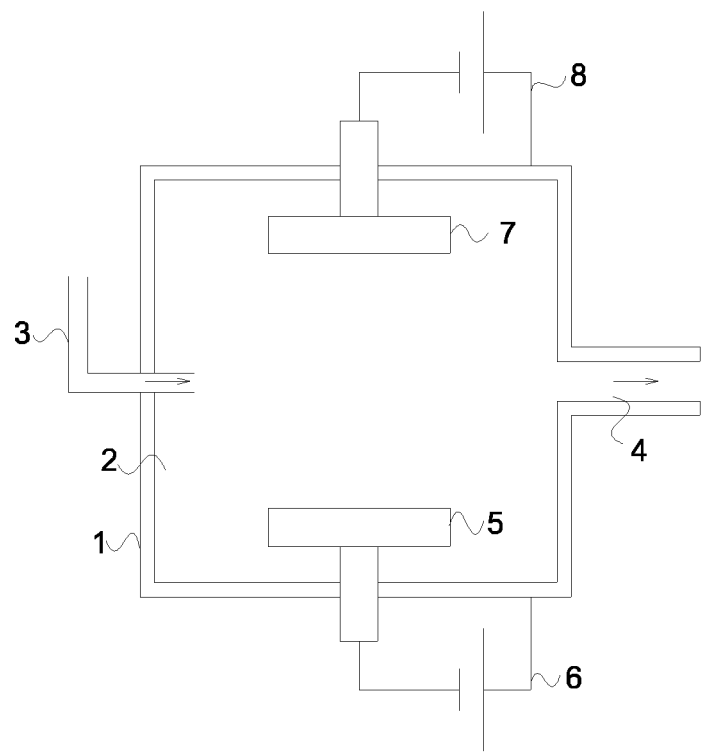
FIG. 5 shows the physical environment for the inventive method.

FIG. 5 shows a device for a reactive magnetron sputtering process, in which the method of controlling according to the invention can be implemented. Chamber of device is formed of an enclosed space 2, defined by walls 1. Gases are introduced the chamber by means of the inlet 3 and they are pumped with pump apparatus connected to 4. The pump apparatus is not shown. The target 5 is formed of the sputtered metal and is connected to the generator 6, which can be either direct current or radiofrequency alternating current. Substrate holder 7 is connected to the generator 8, which can be either direct current or radiofrequency alternating current.

The above described device is well known in the art.

Above described device is used with rotary cylindrical target 8 as a generator. Height of the target was 500 mm, diameter 110 mm. There is applied negative direct voltage to the target. Power applied to the target was in the range of 20 kW.

Substrates are mounted on 3-rotation carousel 7 as a substrate holder around target, distance between substrates and target was around 50 mm. There is applied negative direct voltage to the substrates in range of 50 to 200 V depending on type of process. Several target materials are tested successfully including Al, Ti, Cr, AlTi, and AlCr.

For the purposes of method of control $\bar{d}$ a is used which reflects the mean deviation from last N values of reactive gas flow:

$$\bar{d} = \frac{1}{N}\sum_{i=1}^{N} |q_i - \bar{q}|,$$

wherein $$\bar{q} = \frac{1}{N}\sum_{i=1}^{N} q_i,$$

where $q_i$ is i-th measured reactive gas value. $q_N$ is latest reactive gas value measured, $q_{N-1}$ is reactive gas value measured before $q_N$, continuing to $q_1$, which is last reactive gas value taken into consideration.

Figure 1:
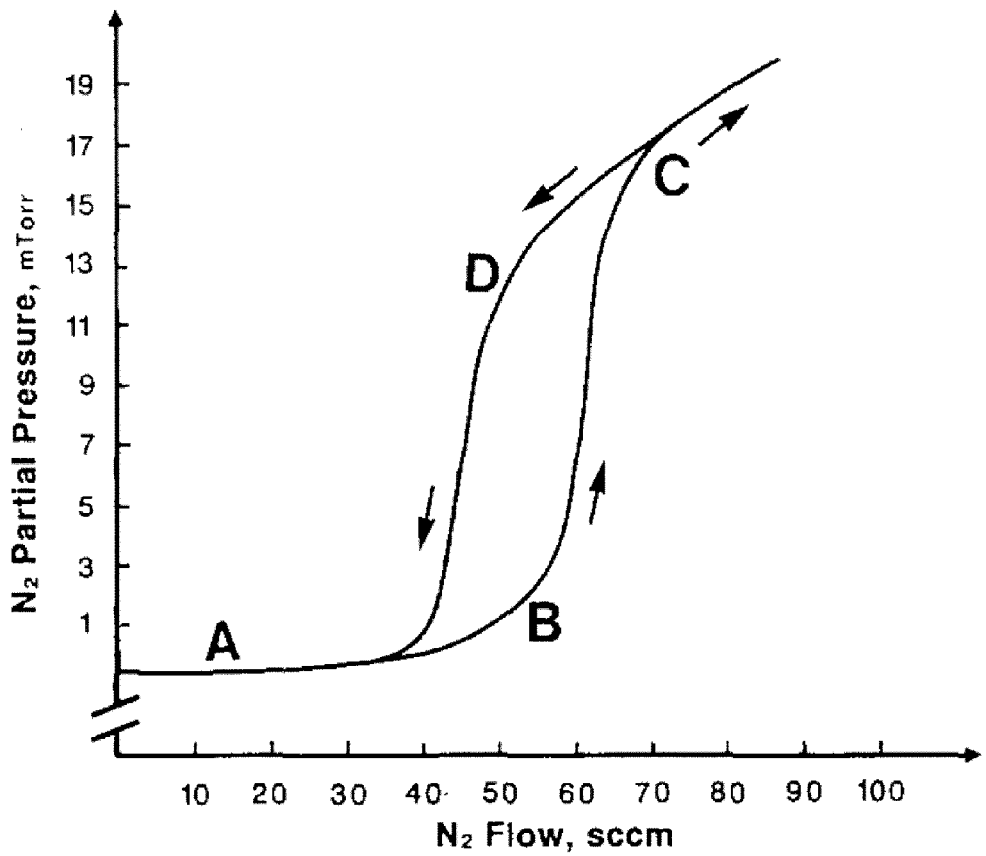
FIG. 1 shows dependency of nitrogen partial pressure on nitrogen flow for reactive magnetron sputtering.
Figure 2:
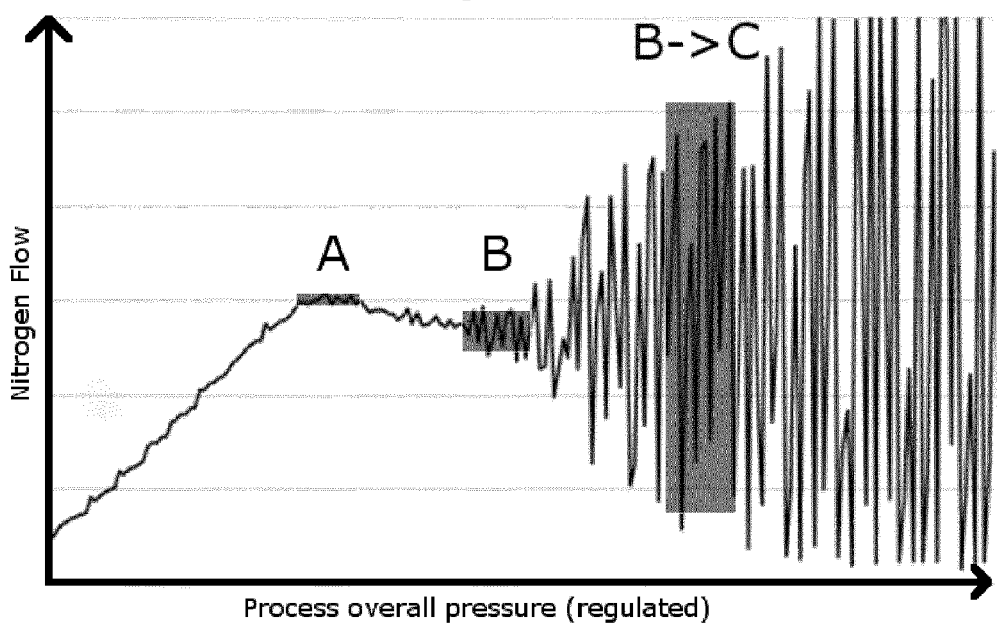
FIG. 2 shows the dependence of nitrogen flow on nitrogen process overall pressure used for regulation.

If the value of $\bar{d}$ is used for regulation of process overall pressure value, a stable deposition in zone B (see FIG. 2) can be achieved as a result of a correct setting of regulation range of $\bar{d}$ and number of samples N.

Figure 3:
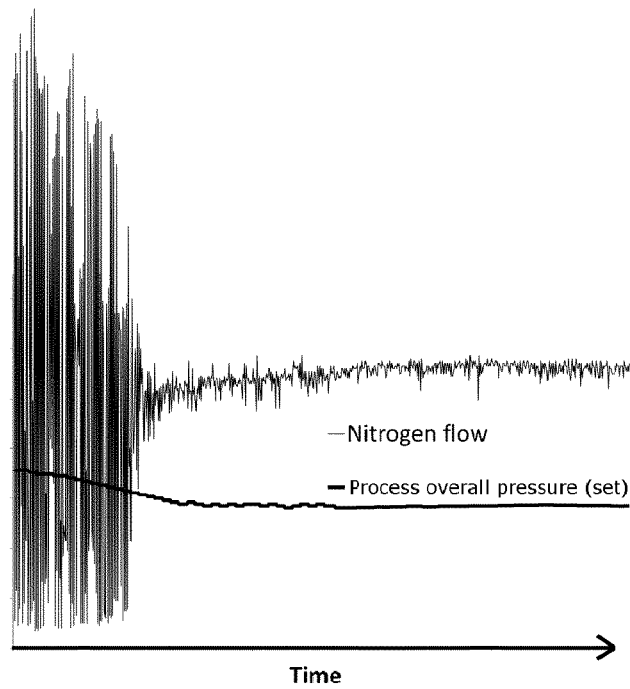
FIG. 3 shows an example of process overall pressure regulation by value of the mean deviation from last N values of reactive gas flow a according to an embodiment of the invention.

FIG. 3 shows an example of process overall pressure regulation by value of the mean deviation from last N values of reactive gas flow $\bar{d}$. As seen in FIG. 3, at the beginning the value of process overall pressure is set from the zone near to C, after some time the process overall pressure value gradually settles on a process value near to point B.

Figure 4:
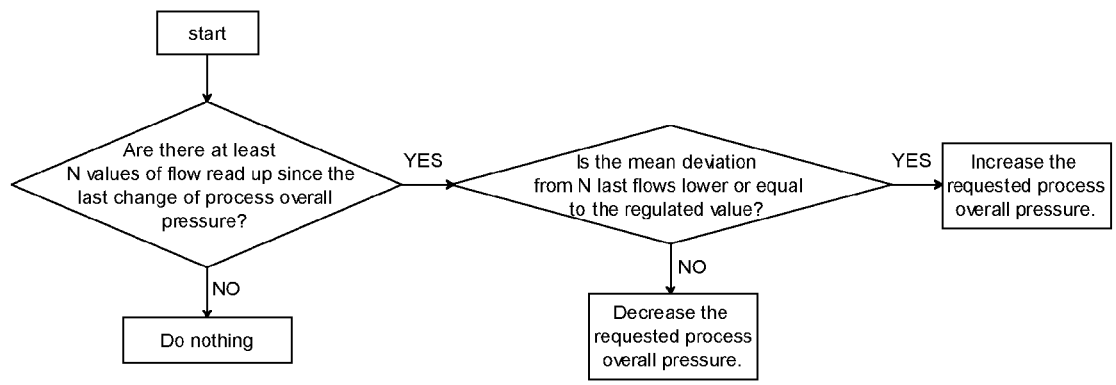
FIG. 4 shows a description of regulation algorithm.

FIG. 4 shows a description of regulation algorithm: Assuming that the regulation upon constant process overall pressure by the means of nitrogen flow is applied during a process, we can use the method of control partially showed in the diagram of FIG. 4. Shown part of method control is performed with each change of nitrogen gas flow. The value N is recommended between the values of 2 to 50. In the preferred embodiment of the invention N is selected in the range from 8 to 12—preferably of 10—for an initial rough, fast search and in the range of 25 to 35—preferably of 30—for slow fine tuning. The regulated value of the mean deviation from last N values of reactive gas flow 2 is recommended between values of 1 and 10 from experiment conducted according to FIG. 2.

INDUSTRIAL APPLICATION

The method of control according to the invention is applicable for regulation of reactive magnetron sputtering process control.

The invention claimed is:

1. A method of controlling a reactive magnetron sputtering process, wherein said magnetron sputtering process uses a reactive gas or reactive gases, characterized by regulating a process overall pressure by a flow of the reactive gas or the reactive gases by determining oscillations in the flow of said reactive gas or reactive gases and using said oscillations as feedback to regulate said process overall pressure, wherein a reactive gas flow rate $q_i$ is measured and the process overall pressure is regulated by calculating a mean deviation from last N measured values of reactive gas flow $\bar{d}$ wherein:

$$\bar{d} = \frac{1}{N} \sum_{i=1}^{N} |q_i - \bar{q}|,$$

and N in a range from 2 to 50, and further wherein:

$q_i$ is a particular measured gas flow rate value;

N is a selected number of last measured values of reactive gas flow;

$\bar{q}$ is an average of N values of $q_i$; and, $\bar{d}$ is an average deviation of measured reactive gas flow values.

2. The method according to claim 1, characterized in that the regulation of the process overall pressure using the flow of the reactive gas or the reactive gases, respectively, is controlled with a PID regulator.

3. The method according to claim 1, characterized in that N is selected in the range of 8 to 12 for an initial rough, fast search.

4. The method according to claim 1, characterized in that N is selected in the range of 25 to 35 for slow fine tuning.

5. The method according to claim 1, characterized in that the reactive gas used is nitrogen, oxygen or a mixture of nitrogen and oxygen.

* * * * *

UNITED STATES PATENT AND TRADEMARK OFFICE
CERTIFICATE OF CORRECTION

PATENT NO. : 9,090,961 B2  Page 1 of 1
APPLICATION NO. : 13/980433
DATED : July 28, 2015
INVENTOR(S) : Ondrej Zindulka and Mojmir Jilek It is certified that error appears in the above-identified patent and that said Letters Patent is hereby corrected as shown below:

In the Specification

Column 2, line 7, change "1.6 s," to --1,6s,--

Column 3, line 17, change "B→C" to --B->C--

Column 3, line 22, change "B→C" to --B->C--

Column 4, line 16, change "a" to -- $\overline{d}$ --

Column 5, line 20, change "2" to -- $\overline{d}$ --

Signed and Sealed this
First Day of December, 2015

Michelle K. Lee
*Director of the United States Patent and Trademark Office*